(12) United States Patent
Nishiwaki et al.

(10) Patent No.: US 6,941,250 B1
(45) Date of Patent: Sep. 6, 2005

(54) STRUCTURAL DESIGN METHOD AND RECORDING MEDIUM

(75) Inventors: Shinji Nishiwaki, Aichi-ken (JP); Hidekazu Nishigaki, Aichi-ken (JP); Noboru Kikuchi, Aichi-ken (JP); Yasuaki Tsurumi, Aichi-ken (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 975 days.

(21) Appl. No.: 09/696,961

(22) Filed: Oct. 27, 2000

(30) Foreign Application Priority Data

Oct. 29, 1999 (JP) .................................. 11-310338
Oct. 20, 2000 (JP) ............................... 2000-321622

(51) Int. Cl.$^7$ .......................... G06F 17/50; G06F 17/10
(52) U.S. Cl. ..................... 703/1; 703/2; 700/30; 700/31
(58) Field of Search ........................ 703/1, 2; 700/29, 700/30, 31; 52/649.2, 650.1

(56) References Cited

U.S. PATENT DOCUMENTS 5,921,048 A * 7/1999 Francom et al. ............... 52/637
6,264,182 B1 * 7/2001 Nishiwaki et al. ........... 267/141

FOREIGN PATENT DOCUMENTS

JP          3-224063          10/1991

OTHER PUBLICATIONS

Manitius et al., A. Joint Node H∞ Control Synthesis for Connected Flexible Beams, Proceedings of the 37th IEEE Conference on Decision and Control, Dec. 1998, pp. 2970-2976.*

Silva et al., E.C.N. Topology Optimization Design of Flextensional Actuators, IEEE Transactions on Ultrasonics, Ferroelectrics, and Frequency Control., vol. 47, No. 3, May 2000, pp. 657-671.*

Banks, H.T. Inverse Problems for Distributed Parameter Systems, Proceedings of the 29th IEEE Conference on Decision and Control, Dec. 1990, pp. 13-16.*

Mullen et al., R.L. Theoretical Modeling of Boundary Conditions in Microfabricated Beams, IEEE, Micro Electro Mechanical Systems, Jan.-Feb. 1991, pp. 154-159.*

Gopinathan et al., M. Linear Quadratic Distributed Self Tuning Control of Vibration in One Dimensional Cantilever Beams, IEEE, Southcon/95, Mar. 1995, pp. 117-122.*

Martin P. Bendsøe, "Optimization of Structural Topology, Shape, and Material", Springer, (16 pages) 1995.

(Continued)

*Primary Examiner*—Russell Frejd
(74) *Attorney, Agent, or Firm*—Oblon, Spivak, McClelland, Maier & Neustadt, P.C.

(57) ABSTRACT

The design domain of an object to be designed is discretized by a plurality of nodes (10), and adjacent nodes and non-adjacent nodes are connected by beam elements (12). Optimization is performed on a design model constructed from the nodes (10) and beam elements (12), to obtain an initial design shape. When maximizing stiffness, the sensitivity of the stiffness matrix is determined, the cross sectional area of the beam elements with high sensitivity is increased, and the cross sectional area of the beam elements with low sensitivity is either reduced or set to zero so that low sensitivity beam elements are substantially removed. By constructing the design model using a plurality of beam elements, a reasonable shape satisfying the boundary condition can be obtained.

8 Claims, 10 Drawing Sheets

OTHER PUBLICATIONS

F. Y. Kocer, et al., http://www.engineering.uiowa.edu/~swan/presentations/asce99.pdf, 7 pages, "Comparison of Continuum and Ground Structure Topology Optimization Methods for Concept Design of Structures", Apr. 1999.

Fujitsu, pp. 1-5, "Comments on Fujitsu Poplas/FEM5 (Structural Analytic Program Using a Finite Element Method) for V22, 99AR-5311-1", Mar. 1992.

NEC, pp. 70-72, "SX Software, Finite Element Method Analyzing System, Guide for FEMLAB/SX", Apr. 1993.

K. Ishii, The Memoir for the $3^{rd}$Optimization Symposium Convention, The Japan Society of Mechanical Engineers, pp. 207-212 "An Application of the Topology Optimization Using the Homogenization Method", Aug. 1998.

* cited by examiner

STRUCTURAL DESIGN METHOD AND RECORDING MEDIUM

BACKGROUND OF THE INVENTION

1. Field of the Invention

The present invention relates to a method for designing a structure and particularly to a method for generating a model at an initial designing stage.

2. Description of the Related Art

Various methods for designing a structure have been proposed. For example, Japanese Patent Laid-Open Publication No. Hei 3-224063 discloses an optimal designing system in which an interface is provided between an analytical calculation section and modeling section; changes of design parameters for a structure and remodeling are automatically performed based on the analytical result; and an optimal model which, satisfies the design specification, is output after design iteration.

In this method, modification of the model makes the design specification satisfied after each iteration. However, this reference does not describe any technique for generating the basic original shape or configuration. Current structural design depends on a designer's experience or on his design notes, and no tool exists for generating the original shape (analysis model). Certainly, it is possible to re-design a configuration using the above method or a design support program, such as the AISI/CARS program for automobile structure member design once the original shape is generated.

Finite element analysis (FEA) based on detailed mesh models is widely used in the analysis phase. However, much calculation time and a large number of design changes are required to regenerate a model after each design change in the case where the original model is unreasonable. This is because the convergence and calculation time is determined from the completeness of the original model.

SUMMARY OF THE INVENTION

The present invention was conceived to solve the above-mentioned problems. One of the objects of the present invention is to provide a method for designing a structure which can easily and quickly generate a reasonable shape at an initial design stage.

In order to achieve the object mentioned above, one aspect of the present invention provides a method for designing a structure comprising the steps of dividing the design domain of the structure into a plurality of nodes, coupling adjacent nodes and coupling non-adjacent nodes by beam elements to set a design model, and optimizing the design model.

According to another aspect of the present invention, a boundary condition is set to the design model and stiffness of beam elements is reconfigured in the optimization process. Here, it is preferable that the boundary condition includes an external force applied to the structure, a fixed condition, and a volumetric condition, and that the optimization performs substantial removal of the beam elements. For a design taking panels into account, it is preferable to add the stiffness contribution of panels to the design domain prior to the optimization.

In the present invention, the design domain of the structure is discretized by a plurality of nodes with the nodes connected with each other by respective beam elements. A modeling scheme called "the ground structure approach" is well known. In this scheme, a design domain is discretized by a plurality of nodes with the adjacent nodes connected with each other by respective trusses. This approach is referred to, for example, in "Optimization of Structural Topology Shape and Material", Martin Philip Bendsoe, Springer, 1995. However, in the present invention, in addition to the adjacent nodes being connected as in the ground structure approach, non-adjacent nodes are also connected. These connections are made by beam elements, rather than truss elements. Connecting the non-adjacent nodes can increase the number of variations in the generated shape. Furthermore, by using a beam elements for node connections in the present invention, rather than truss elements as in the related models, more detailed and exact optimal shapes satisfying the predetermined limitation condition can be generated. In an embodiment of the present invention all the adjacent nodes must be connected, but not all the non-adjacent nodes must be connected by beam elements. However, the accuracy of the generated model increases as the number of connected non-adjacent nodes increases.

As a method for optimizing a design model constructed using nodes and beam elements, for example, a optimal shape with maximum stiffness can be generated by applying a predetermined boundary condition to the design model and modifying the stiffness of beam elements. As a boundary condition, an external force and fixed condition can be applied, and optimization can be performed so that the displacement under a constant volume constraint is minimized. The optimization is performed by adjusting the stiffness of beam elements, and a predetermined volume constraint can be satisfied by substantially removing the beam elements which do not substantially contribute to maximization of stiffness. Substantial removal includes cases where the beam elements are directly deleted from the data and also cases where the practical existence of the beam elements is negated by setting the value of a parameter of the beam element equal to zero. For example, the value of the parameter representing the cross-sectional area could be set equal to zero. When data itself is deleted, the number of data points which play a role in the calculation changes. This results in increased complexity in the calculation algorithm. However, by substantially removing data, the complexity in the calculation algorithm can be reduced.

When designing a structure such as an automobile body or a house, panel elements contribute to stiffness in addition to the frame structure. Thus, by adding the stiffness contributions from panel elements to the nodes in the design model constructed from nodes and beam elements, optimization can be performed using the same algorithm in the case where no panel element is employed.

It is preferable that the cross-section of the beam element has a shape that is represented by at least 2 design variables. By setting the number of design variables to 2, elliptic and rectangular cross-sections can be represented, and by setting the number to 3 or more, various complex cross-sectional shapes can be represented. With such a configuration, at the optimization step, design of beam cross sections is also possible in addition to the ability to lay out the beams.

It is preferable to determine the dimensions of the cross-section and the angle of the main axis of the cross-section with respect to the local coordinate system of a beam element during optimization process.

Therefore, it is possible to determine the main axis direction (angle) of the cross section in addition to the dimension of the cross section. This results in increasing the number of degrees of freedom for design and in improving the performance of the product. In practice, most of the beam structures used for machine parts have a cross-sectional main axis. Thus, the capability to determine the direction of the cross sectional main axis is very useful in machine designing.

Another aspect of the present invention provides a computer readable medium for storing a program for designing a model of a structure. The program causes the computer to discretize the design domain of the structure by a plurality of nodes; to generate a design model which is constructed by connecting the adjacent nodes and connecting the non-adjacent nodes by beam elements; and to optimize the design model.

It is also preferable that the program causes the computer to perform the optimization by modifying the stiffness of the beam elements. This modification is based on an input boundary condition, where the boundary condition includes an external force applied to the structure, a fixed condition, and a volume constraint. It is also preferable that the optimization include substantial removal of the beam elements.

DESCRIPTION OF THE PREFERRED EMBODIMENT

A preferred embodiment of the present invention will now be explained referring to the attached diagrams. In practice, the design method of the present invention can be performed on a computer by installing the processing program to a computer such as a personal computer or a workstation. Because the design model of the present invention uses elements based on structural mechanics, such as a beam element and a panel element, a high capacity memory is not necessary. It is possible, for example, to use common spreadsheet software as a front end interface on a personal computer. The processing program can be recorded in any preferred medium which can hold information electromagnetically, optically, or chemically, such as a CD-ROM, DVD, a common hard drive, or a semiconductor memory. The installation of the processing program can be executed by, for example, storing the processing program on a CD-ROM and supplying the processing program from the CD-ROM to the hard drive of a computer. It is also possible to store the processing program in a hard drive or a ROM of a computer and to use the computer as a workstation dedicated to designing structure models.

Figure 1:
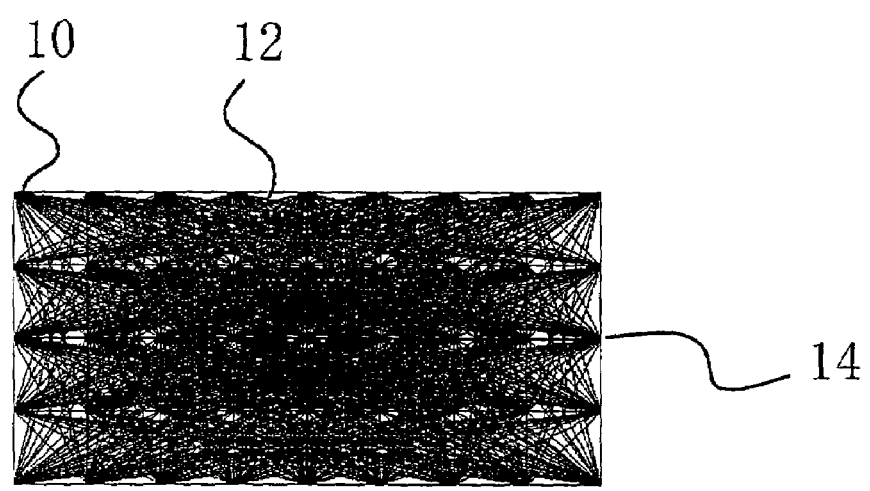
FIG. 1 is a structural diagram of a design model according to a preferred embodiment of the present invention.

FIG. 1 shows schematically a design model used to illustrate the preferred embodiment of the present invention. The design domain of an object to be designed or an object to be analyzed (hereinafter, the term "design" is assumed to include analysis) is made discrete by a plurality of nodes 10. Adjacent nodes are connected by a beam element 12. In addition, non-adjacent nodes are also connected by beam elements 12. In FIG. 1, all the adjacent nodes are connected by beam elements 12 and all the non-adjacent nodes are also connected by beam elements 12. Connecting all non-adjacent nodes by beam elements 12 is not necessary, but it is advantageous to have the number of beam elements 12 as large as possible in order to generate an optimal initial design shape. In the example of the present embodiment, since an optimal original shape is generated even though no shape (configuration) is provided at the initial stage, the number of varieties of shapes which can be generated increases as the number of beam elements increases. Therefore, it is preferable to connect all the non-adjacent nodes by beam elements 12. In this manner, a design model is set, and the design model is then optimized by setting boundary conditions.

Figure 2:
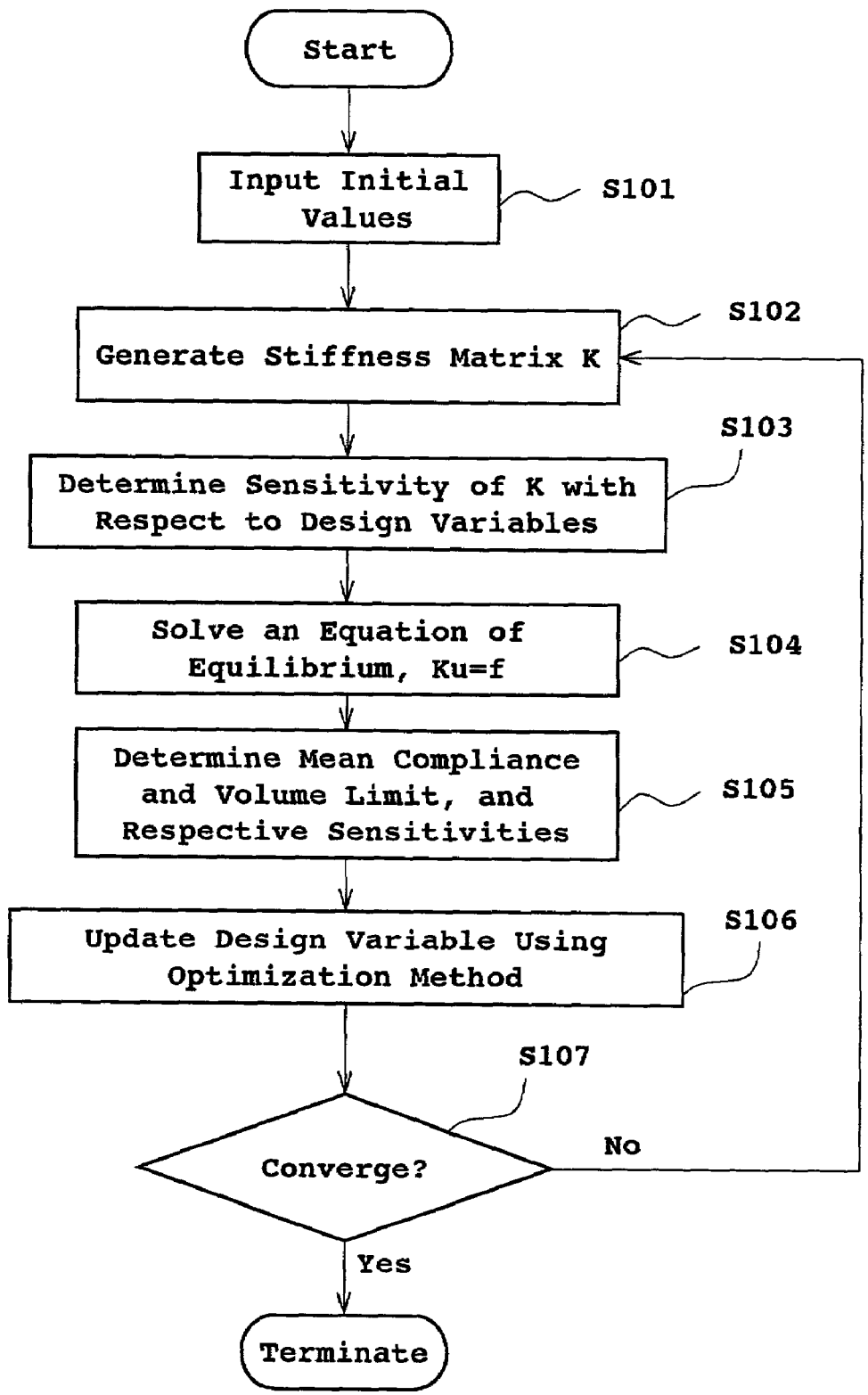
FIG. 2 is a processing flowchart of the preferred embodiment of the present invention.

FIG. 2 is a processing flowchart for maximizing the stiffness of a structure using the design model depicted in FIG. 1. First, an initial value is input (step S101). Here, "inputting the initial value" refers to discretizing the design domain with a plurality of nodes 10, connecting the nodes 10 by beam elements 12, and inputting the boundary conditions. The boundary condition includes an external force load and a volume constraint. In the present example, we describe a case where the structure on the left side in FIG. 1 is constrained and a load is applied to the central portion 14 at the right side.

After the initial value is input, a stiffness matrix K of the entire structure is constructed (step S102). In general, when the design model comprises a plurality of nodes 10 and beam elements 12, the relationship between force and displacement of nodes can be represented by f=Ku, where f is the force vector, u is the displacement vector, and K is the stiffness matrix. K, in the equation for defining the relationship between the force and displacement, is the stiffness matrix of the structure, and can be represented by superposition of elemental stiffness matrices $K_e$ represented by the following equation:

$$Ke = \begin{bmatrix} \frac{EA}{l} & & & & & & & & & & & \\ 0 & \frac{12EI_{xx}}{l^3} & & & & & \text{Symmetric} & & & & & \\ 0 & 0 & \frac{12EI_{yy}}{l^3} & & & & & & & & & \\ 0 & 0 & 0 & \frac{GJ}{l} & & & & & & & & \\ 0 & 0 & -\frac{6EI_{yy}}{l^2} & 0 & \frac{4EI_{yy}}{l} & & & & & & & \\ 0 & \frac{6EI_{xx}}{l^2} & 0 & 0 & 0 & \frac{4EI_{xx}}{l^3} & & & & & & \\ -\frac{EA}{l} & 0 & 0 & 0 & 0 & 0 & \frac{EA}{l} & & & & & \\ 0 & -\frac{12EI_{zz}}{l^3} & 0 & 0 & 0 & -\frac{6EI_{xx}}{l^2} & 0 & \frac{12EI_{xx}}{l^3} & & & & \\ 0 & 0 & -\frac{12EI_{yy}}{l^3} & 0 & \frac{6EI_{yy}}{l^2} & 0 & 0 & 0 & \frac{12EI_{yy}}{l^3} & & & \\ 0 & 0 & 0 & -\frac{GJ}{l} & 0 & 0 & 0 & 0 & 0 & \frac{GJ}{l} & & \\ 0 & 0 & -\frac{6EI_{yy}}{l^2} & 0 & \frac{2EI_{yy}}{l} & 0 & 0 & 0 & \frac{6EI_{yy}}{l^2} & 0 & \frac{4EI_{yy}}{l} & \\ 0 & \frac{6EI_{xx}}{l^2} & 0 & 0 & 0 & \frac{2EI_{xx}}{l} & 0 & -\frac{6EI_{xx}}{l^2} & 0 & 0 & 0 & \frac{4EI_{xx}}{l} \end{bmatrix} \quad \text{(Eq 1)}$$

where A is the cross-sectional area of a beam element, E is the Young's modulus, G is the shear modulus, 1 is the length of a beam element, $I_{yy}$, $I_{zz}$, and J are second moments of inertia. Specifically, $I_{yy}$, $I_{zz}$, and J are respectively second moments of inertia with respect to bending in y axis direction and z axis direction, and torsion of the beam around the x axis. In this matrix, "Symmetric" refers to a symmetrical matrix. From the above equation, it can be clearly understood that a beam element is different from a truss element. More limitations arise when modeling using a truss because a truss has stiffness with respect to only one axis whereas a beam element has stiffness with respect to six axes. In the present invention, by using a beam element, instead of a truss element, an optimal configuration which has a greater degree of freedom, but which still satisfies a predetermined limiting condition, can be generated.

After stiffness matrix K is generated, the sensitivity of K with respect to a design variable is obtained (step S103). The simplest example would be a case where the cross-section is assumed to be a solid circle and the design variable is set as the cross-sectional area. In such a case, the direction of the main axis of the cross-section is not determined. A design variable in this example is the normalized cross-sectional area $\rho(0 \leq \rho \leq 1)$ and a relationship, $$A = \rho A_{max} \quad \text{(Eq 2)}$$

holds with respect to the cross-sectional area A, where Amax is the maximum value, and $\rho$ ultimately becomes either 0 or 1. The normalized cross-sectional area is used in order to simplify the calculation. The differential value of K with respect to $\rho$ must be determined in order to determine the sensitivity of the stiffness matrix K with respect to the design variable $\rho$. If the cross-section of a beam element is assumed to have a diameter of d, the following relationships are obtained:

$$I_{yy} = I_{zz} = \frac{\pi}{64}d^4 = \frac{\rho^2 A_{max}^2}{4\pi} \quad \text{(Eq 3)}$$

$$J = \frac{\pi}{32}d^4 = \frac{\rho^2 A_{max}^2}{2\pi}. \quad \text{(Eq 4)}$$

Thus, the relationships yield, $$\frac{\partial A}{\partial \rho} = A_{max} \quad \text{(Eq 5)}$$

$$\frac{\partial I_{yy}}{\partial \rho} = \frac{\partial I_{zz}}{\partial \rho} = \frac{\rho A_{max}^2}{2\pi} \quad \text{(Eq 6)}$$

$$\frac{\partial J}{\partial \rho} = \frac{\rho A_{max}^2}{\pi}. \quad \text{(Eq 7)}$$

By using these equations, the sensitivity of the stiffness matrix K with respect to the design variable $\rho$ can be derived.

After the sensitivity of the stiffness matrix K is obtained, an equation of equilibrium, f = Ku, is solved for u (step S104). Specifically, by multiplying the external force f by an inverse matrix K−1 of the stiffness matrix Ku can be determined. After determining u, the mean compliance, a volume constraint, and respective sensitivities are calculated (step S105). The mean compliance is an objective function which is the objective for optimization. In the case of maximizing the stiffness, it is known that stiffness can be maximized by designating (f·u) as an objective function, and minimizing the objective function (f·u). Here, vector f is an external force given as a boundary condition and u is derived at step S104. Therefore, by using these values, (f·u) can be determined. The volume constraint can be set as ratio of initial volume of the initial configuration. For example, if the initial volume of the design domain is set as 100%, a volume limit of 20% (i.e. reduce 100% to 20%) can be given. The volume limit can also be given as a weight (for example, limit 100 kg to 20 kg). The sensitivity of the mean compliance is obtained as the following relationship:

$$f = f \cdot u = u^T K u \quad \text{(Eq 8)}$$

Therefore, the sensitivity of (f·u), that is, the differential value of (f·u) with respect to the design variable ρ, is:

$$\frac{\partial f}{\partial \rho} = -u^T \frac{\partial K}{\partial \rho} u. \quad \text{(Eq 9)}$$

where T represents the transpose of a matrix. Because the sensitivity of the stiffness matrix K is already determined in the process at step S103, the sensitivity of (f·u) can be determined. The sensitivity of the volume constraint can also be determined by determining the differential of the volume with respect to the design variable ρ.

After determining the mean compliance, volume constraint, and respective sensitivities, the design variable p is updated and optimized by an optimization method using these values (step S106). As an optimization method, any of the known methods can be used such as SLP (sequential linear planning) or CONLIN (a type of sequential convex function approximation). The optimization algorithm describes a scheme to solve the problem of minimizing the objective function, (f·u), and is an algorithm to determine ρ which minimizes (f·u) considering respective sensitivities of the mean compliance (f·u) and volume constraint with respect to ρ. Specifically, the cross-sectional area of a beam element 12 which has a high sensitivity is increased and the cross-sectional area of a beam element 12 with a low sensitivity is reduced, or the beam element itself is substantially removed by setting the cross-sectional area to zero. By substantially removing the beam elements 12 with low sensitivity, the volume can be reduced and the volume constraint can be satisfied. After the optimization, it is then judged whether or not the optimization converged (i.e. a minimum solution is obtained) (step S107), and, if not, processes at steps S102 through S106 are repeated. In other words, the cross-sectional area of the beam elements 12 are changed, value of (f·u) is examined, and if a minimum solution cannot be obtained, the cross-sectional area of the beam elements 12 are again changed for optimization.

Figure 3:
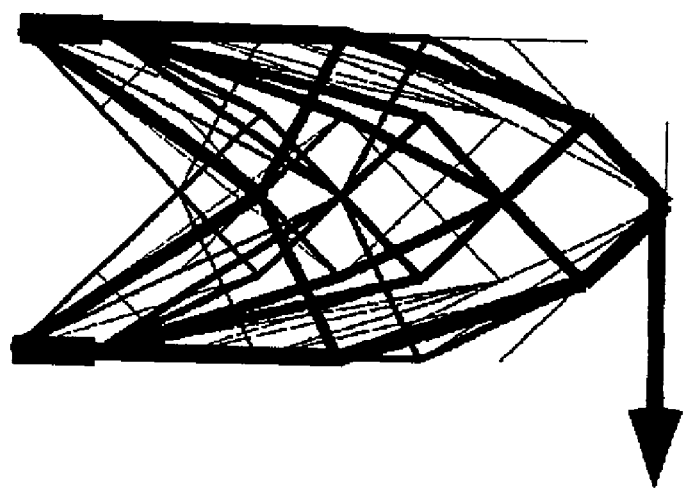
FIG. 3 is a descriptive diagram showing the result of optimization of the design model depicted in FIG. 1.

FIG. 3 shows a shape optimized through the processes described above for the structure depicted in FIG. 1. Here, only the beam elements 12 with high sensitivity remain, now with their stiffness optimized. In other words, these beam elements remain with increased cross-sectional area, whereas the beam elements 12 with low sensitivity are substantially removed to yield a shape with maximized stiffness according to the predetermined boundary conditions (constraint condition, external force, and volume constraint). The thickness of the lines in the figure stands for the size of the cross-sectional area of the beam elements 12. The thicker beam elements 12 have larger cross-sectional areas. Such a shape can be used as an initial design shape, and more detailed analysis can then be performed by FEA when preferable. Even when FE analysis is performed, because the initial shape depicted in FIG. 3 is a mechanically reasonable shape, the analysis will converge quickly and the calculation time will be short.

While in the above description a beam element 12 whose cross-section is a solid circle with a cross-sectional area of $\pi d^2/4$ was chosen as a simple example, the invention is not limited to simple beam elements and can be preferably employed with more complex shaped beam elements 12.

Consider a case where k design variables are set for one beam cross-section. Each design variable is represented by xi (i=1, 2, . . . , k) with a respective maximum value of xmaxi. Using design variables ρi, which are normalized values for design variables xi, the relationship is represented as follows:

$$x_i = x_{maxi} \rho_i \quad \text{(Eq 10)}$$

$\rho_i$ satisfies the condition, $$0 \leq \rho_i \leq 1. \quad \text{(Eq 11)}$$

During optimization, the design variables are replaced by these $\rho_i$ to determine the optimal solution. Moreover, when the cross-sectional shape is not symmetrical with respect to two main axis directions, a main axis direction must be determined to minimize the objective function. Here, the angle of the main axis direction with respect to the local coordinate system of a beam is represented by θ to determine an optimal rotational angle.

The mean compliance shown in the following equation is used similar to the above case as an objective function f. In other words, with the load vector f applied to the structure and displacement vector u, the objective function can be represented as, $$f = f \cdot u = u^T K u \quad \text{(Eq 12)}$$

similar to the above equation 8.

The objective function f can also be represented by, $$f = f(\rho_1, \ldots, \rho_k, \theta). \quad \text{(Eq 13)}$$

This is because the objective function is a function of normalized values (design variables) $\rho_i$(i=1, 2, 3, . . . , k) and a rotational angle θ.

The optimization should be performed to satisfy the following equation:

$$\text{minimize } f = f \cdot u = {}^T K u$$

$$\rho_1, \ldots, \rho_k, \theta. \quad \text{(Eq 14)}$$

The constraints are, $$V = V(\rho_1, \ldots, \rho_k) \leq V^U$$

$$0 \leq \rho_i \leq 1 \text{ for } i=1, \ldots, k \; Ku = f \quad \text{(Eq 15)}$$

where V is the total volume of the structure and Vu is a preset maximum volume constraint. Then, we set Λ, $\lambda_1$, and $\lambda_2$, as Lagrange multipliers to define the following Lagrangian L.

$$L = f + \Lambda(V - V^U) + \lambda_1(-\rho_i) + \lambda_2(P_i - 1) \quad \text{(Eq 16)}$$

The KKT-conditions are, $$\frac{\partial L}{\partial \rho_i} = \frac{\partial f}{\partial \rho_i} + \Lambda\left(\frac{\partial V}{\partial \rho_i}\right) - \lambda_1 + \lambda_2 \quad \text{(Eq 17)}$$

$$= -u^T \frac{\partial K}{\partial \rho_i} u + \Lambda\left(\frac{\partial V}{\partial \rho_i}\right) - \lambda_1 + \lambda_2 = 0$$

$$\frac{\partial L}{\partial \theta} = \frac{\partial f}{\partial \theta} = -u^T \frac{\partial K}{\partial \theta} u = 0$$

$$\Lambda(V - V^U) = 0$$

$$\lambda_1(-\rho_i) = 0$$

-continued $$\lambda_2(\rho_i - 1) = 0$$

$$\Lambda \geq 0$$

$$\lambda_1 \geq 0$$

$$\lambda_2 \geq 0$$

$$V - V^U \leq 0$$

$$-\rho_i \leq 0$$

$$\rho_i - 1 \leq 0$$

The optimal solution can be obtained by determining design variables ρi which satisfy these equations. Here, any of the known methods can be used for design variables ρi, similar to the above case for a cross-sectional area as one design variable. For the design variable θ, on the other hand, an optimal solution can be obtained by determining a solution that satisfies the equation 11. In the optimization method mentioned above, it is necessary to determine sensitivities of the objective function f and of the limiting conditions with respect to the design variables $\rho_i$. The sensitivity of the objective function can be determined from, 5 similar to the above equation 9, $$\frac{\partial f}{\partial \rho_i} = -u^T \frac{\partial K}{\partial \rho_i} u \qquad \text{(Eq 18)}$$

where K is the stiffness matrix of the whole structure. This equation is similar to equation 9 except that a plurality of ρs must be taken into account. That is, in this example, since the number of design variables is i, sensitivities for each design variables must be determined.

Figure 4B:
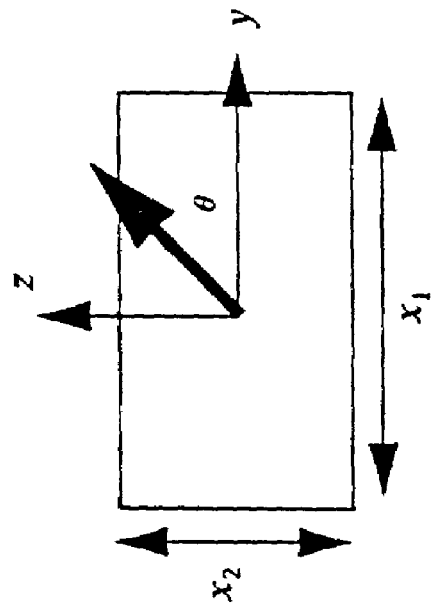
FIGS. 4A, 4B, 4C and 4D are diagrams showing specific examples of cross-sectional shapes.
Figure 4D:
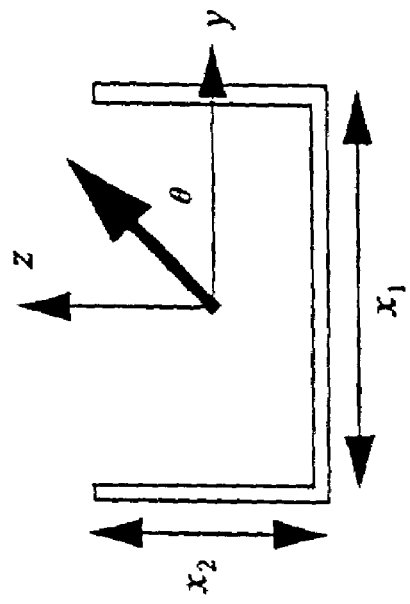
Figure 4A:
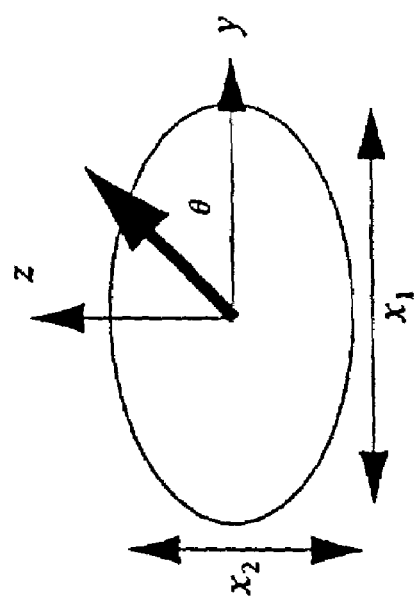
Figure 4C:
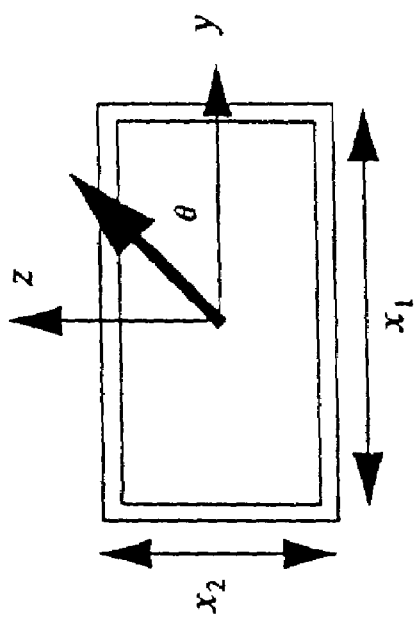

FIGS. 4A through 4D show four cross-sectional shapes to which the present invention can be applied. FIG. 4A shows an elliptic cross-section, FIG. 4B shows a rectangular cross-section, FIG. 4C shows a hollow rectangular cross-section, and FIG. 4D shows a C-type cross-section.

For example, in the case of an elliptic cross-section depicted in FIG. 4A, the cross-sectional area A of the beam, second moment of inertia Iy in the y axis direction, second moment of inertia $I_z$ in the z axis direction, and polar moment of inertia J can be determined as:

$$A = \frac{\pi}{4} x_1 x_2 \qquad \text{(Eq 19)}$$

$$I_z = \frac{\pi}{64} x_1^3 x_2$$

$$I_y = \frac{\pi}{64} x_1 x_2^3$$

$$J = \frac{\pi}{32} \frac{x_1^3 x_2^3}{x_1^2 + x_2^2}$$

Using the cross-sectional area A of the beam, the second moment of inertia Iy in the y axis direction, the second moment of inertia Iz in the z axis direction, and the polar moment of inertia J; the stiffness matrix $K_e$ of a beam element can be derived from R and $K_{ep}$ as follows:

$$Ke = R^T KepR \qquad \text{(Eq 20)}$$

where $K_{ep}$ and R are defined by, $$Kep = \begin{bmatrix} \frac{EA}{L} & & & & & & & & & & & \\ 0 & \frac{12EI_x}{L^3} & & & & & & \text{Symmetric} & & & & \\ 0 & 0 & \frac{12EI_y}{L^3} & & & & & & & & & \\ 0 & 0 & 0 & \frac{GJ}{L} & & & & & & & & \\ 0 & 0 & -\frac{6EI_y}{L^2} & 0 & \frac{4EI_y}{L} & & & & & & & \\ 0 & \frac{\partial EI_x}{L^2} & 0 & 0 & 0 & \frac{4EI_x}{L^3} & & & & & & \\ -\frac{EA}{L} & 0 & 0 & 0 & 0 & 0 & \frac{EA}{L} & & & & & \\ 0 & -\frac{12EI_z}{L^3} & 0 & 0 & 0 & -\frac{6EI_x}{L^2} & 0 & \frac{12EI_x}{L^3} & & & & \\ 0 & 0 & -\frac{12EI_y}{L^3} & 0 & \frac{6EI_y}{L^2} & 0 & 0 & 0 & \frac{12EI_y}{L^3} & & & \\ 0 & 0 & 0 & -\frac{GJ}{L} & 0 & 0 & 0 & 0 & 0 & \frac{GJ}{L} & & \\ 0 & 0 & -\frac{6EI_y}{L^2} & 0 & \frac{2EI_y}{L} & 0 & 0 & 0 & \frac{6EI_y}{L^2} & 0 & \frac{4EI_y}{L} & \\ 0 & \frac{6EI_x}{L^2} & 0 & 0 & 0 & \frac{2EI_x}{L} & 0 & -\frac{6EI_x}{L^2} & 0 & 0 & 0 & \frac{4EI_x}{L} \end{bmatrix} \qquad \text{(Eq 21)}$$

$$R = \begin{bmatrix} 1 & 0 & 0 & 0 & 0 & 0 & 0 & 0 & 0 & 0 & 0 & 0 \\ 0 & \cos\theta & \sin\theta & 0 & 0 & 0 & 0 & 0 & 0 & 0 & 0 & 0 \\ 0 & -\sin\theta & \cos\theta & 0 & 0 & 0 & 0 & 0 & 0 & 0 & 0 & 0 \\ 0 & 0 & 0 & 1 & 0 & 0 & 0 & 0 & 0 & 0 & 0 & 0 \\ 0 & 0 & 0 & 0 & \cos\theta & \sin\theta & 0 & 0 & 0 & 0 & 0 & 0 \\ 0 & 0 & 0 & 0 & -\sin\theta & \cos\theta & 0 & 0 & 0 & 0 & 0 & 0 \\ 0 & 0 & 0 & 0 & 0 & 0 & 1 & 0 & 0 & 0 & 0 & 0 \\ 0 & 0 & 0 & 0 & 0 & 0 & 0 & \cos\theta & \sin\theta & 0 & 0 & 0 \\ 0 & 0 & 0 & 0 & 0 & 0 & 0 & -\sin\theta & \cos\theta & 0 & 0 & 0 \\ 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & \cos\theta & \sin\theta \\ 0 & 0 & 0 & 0 & 0 & 0 & 0 & 0 & 0 & 0 & -\sin\theta & \cos\theta \end{bmatrix}$$

When two design variables are used such as the cases depicted in FIGS. 4A through 4D, the design variables $x_1$ and $x_2$ can be represented by, $$x_1 = x_{max1} \rho_1$$
$$x_2 = x_{max2} \rho_2 \quad \text{(Eq 22)}$$

using normalized design variables $\rho_1$ and $\rho_2$, similar to the earlier case. By determining respective sensitivities of A, $I_y$, $I_z$ and J with respect to $\rho_1$ and $\rho_2$, respectively, sensitivities of the stiffness matrix of the beam element with respect to the design variables, $\partial K/\partial \rho_1$ and $\partial K/\partial \rho_2$, can be obtained. Thus, the sensitivity of the objective function f can be computed using equation 18. From the sensitivity, the optimization calculation can be performed as above to obtain an optimal solution.

The update value of the rotational angle θ of the beam element (angle of the cross sectional main axis with respect to the beam element coordinate system) can be determined from an equation derived from the KKT-conditions.

$$u_e^T \frac{\partial K_e}{\partial \theta} u_e = 0 \quad \text{(Eq 23)}$$

The partial differential equation of the objective function f with respect to the design variable θ yields polynomial solutions of sinusoidal functions, and thus, the value of θ can be determined from any known value calculation method.

In other words, $K_e$ becomes, from the above equation 20, $$Ke = \begin{bmatrix}
\frac{EA}{L} & & & & & & & & & & & \\
0 & \frac{12EI_2}{L^3} & & & & & & & \text{Symmetric} & & & \\
0 & -\frac{12EI_{12}}{L^3} & \frac{12EI_1}{L^3} & & & & & & & & & \\
0 & 0 & 0 & \frac{GJ}{L} & & & & & & & & \\
0 & \frac{6EI_{12}}{L^2} & -\frac{6EI_1}{L^2} & 0 & \frac{4EI_1}{L} & & & & & & & \\
0 & \frac{6EI_2}{L^2} & -\frac{6EI_{12}}{L^2} & 0 & \frac{4EI_{12}}{L} & \frac{4EI_2}{L} & & & & & & \\
-\frac{EA}{L} & 0 & 0 & 0 & 0 & 0 & \frac{EA}{L} & & & & & \\
0 & -\frac{12EI_2}{L^3} & \frac{12EI_{12}}{L^3} & 0 & -\frac{6EI_{12}}{L^2} & -\frac{6EI_x}{L^2} & 0 & \frac{12EI_2}{L^3} & & & & \\
0 & \frac{12EI_{12}}{L^3} & -\frac{12EI_1}{L^3} & 0 & \frac{6EI_1}{L^2} & \frac{6EI_{12}}{L^2} & 0 & -\frac{12EI_{12}}{L^3} & \frac{12EI_1}{L^3} & & & \\
0 & 0 & 0 & -\frac{GJ}{L} & 0 & 0 & 0 & 0 & 0 & \frac{GJ}{L} & & \\
0 & \frac{6EI_{12}}{L^2} & -\frac{6EI_1}{L^2} & 0 & \frac{2EI_1}{L} & \frac{2EI_{12}}{L} & 0 & -\frac{6EI_{12}}{L^2} & \frac{6EI_1}{L^2} & 0 & \frac{4EI_1}{L} & \\
0 & \frac{6EI_2}{L^2} & -\frac{6EI_{12}}{L^2} & 0 & \frac{2EI_{12}}{L} & \frac{2EI_2}{L} & 0 & -\frac{6EI_2}{L^2} & -\frac{6EI_{12}}{L^2} & 0 & \frac{4EI_{12}}{L} & \frac{4EI_2}{L}
\end{bmatrix} \quad \text{(Eq 24)}$$

where $I_1$, $I_2$, and $I_{12}$ are $$I_1 = \frac{1}{2}(I_y + I_Z) + \frac{1}{2}(I_y - I_Z)\cos 2\theta \quad \text{(Eq 25)}$$

-continued $$I_2 = \frac{1}{2}(I_y + I_Z)\frac{1}{2}(-I_y + I_Z)\cos 2\theta$$

$$I_{12} = \frac{1}{2}(I_y - I_Z)\sin 2\theta$$

It follows that the sensitivity of $K_e$ is $$\frac{\partial K_e}{\partial \theta} = \begin{bmatrix} 0 & & & & & & & & & & & & \text{Symmetric} \\ 0 & \frac{12EI_S}{L^3} \\ 0 & -\frac{12EI_C}{L^3} & \frac{12EI_S}{L^3} \\ 0 & 0 & 0 & 0 \\ 0 & \frac{6EI_C}{L^2} & \frac{6EI_S}{L^2} & 0 & -\frac{4EI_S}{L} \\ 0 & \frac{6EI_S}{L^2} & -\frac{6EI_C}{L^2} & 0 & \frac{4EI_C}{L} & \frac{4EI_2}{L} \\ 0 & 0 & 0 & 0 & 0 & 0 & 0 \\ 0 & -\frac{12EI_S}{L^3} & \frac{12EI_C}{L^3} & 0 & -\frac{6EI_C}{L^2} & -\frac{6EI_x}{L^2} & 0 & \frac{12EI_S}{L^3} \\ 0 & \frac{12EI_C}{L^3} & \frac{12EI_S}{L^3} & 0 & -\frac{6EI_S}{L^3} & \frac{6EI_C}{L^3} & 0 & -\frac{12EI_C}{L^3} & -\frac{12EI_S}{L^3} \\ 0 & 0 & 0 & 0 & 0 & 0 & 0 & 0 & 0 & 0 \\ 0 & \frac{6EI_C}{L^2} & \frac{6EI_S}{L^2} & 0 & -\frac{2EI_S}{L} & \frac{2EI_C}{L} & 0 & -\frac{6EI_C}{L^2} & -\frac{6EI_S}{L^2} & 0 & -\frac{4EI_S}{L} \\ 0 & \frac{6EI_S}{L^2} & -\frac{6EI_C}{L^2} & 0 & \frac{2EI_C}{L} & \frac{2EI_S}{L} & 0 & -\frac{6EI_S}{L^2} & \frac{6EI_C}{L^2} & 0 & \frac{4EI_C}{L} & \frac{4EI_S}{L} \end{bmatrix}$$

(Eq 26)

wherein $I_s$ and $I_c$ are $$I_S = (I_y - I_Z)\sin 2\theta = -\frac{\partial I_1}{\partial \theta} = \frac{\partial I_2}{\partial \theta}$$ (Eq 27)

$$I_C(I_y - I_Z)\cos 2\theta = \frac{\partial I_{12}}{\partial \theta}$$

If the displacement vector $U_e$ of the element is represented by $$Ue = \{u_{1x}, u_{1y}, u_{1z}, \theta_{1x}, \theta_{1y}, \theta_{1z}, u_{2x}, u_{2y}, u_{2z}, \theta_{2x}, \theta_{2y}, \theta_{2z}\}^T$$ (Eq 28)

equation 23 becomes $$Ue^T \frac{\partial K_e}{\partial \theta} Ue = \frac{4D}{L^3}\{C_1 I_C + C_2 I_S\}$$ (Eq 29)

$$= \frac{4D}{L^3}\{C_1(I_y - I_Z)\cos 2\theta + C_2(I_y - I_Z)\sin 2\theta\}$$

$$= \frac{4D}{L^3}(I_y - I_Z)\{C_1\cos 2\theta + C_2\sin 2\theta\} = 0$$

where $C_1$, and $C_2$ are $C_1 = 6u_{1y}u_{1z} + 6u_{1y}u_{2z} + 6u_{1z}u_{2y} - 6u_{2y}u_{2z}$ $+3Lu_{1y}\theta_{1y} + 3Lu_{1y}\theta_{2y} - 3Lu_{1z}\theta_{1z} - 3Lu_{1z}\theta_{2x}$ $-3Lu_{2y}\theta_{1y} - 3Lu_{2y}\theta_{2y} + 3Lu_{2z}\theta_{1z} + 3Lu_{2z}\theta_{2z}$ $+2L^2\theta_{1y}\theta_{1z} + L^2\theta_{1z}\theta_{2y} + L^2\theta_{1y}\theta_{2z} + 2L^2\theta_{2y}\theta_{2z}$ $C_2 = 3u_{1y}^2 - 6u_{1y}u_{2y} - 3u_{1z}^2 + 3u_{2y}^2 + 6u_{1z}u_{2z} - 3u_{2z}^2$ $+3Lu_{1z}\theta_{1y} - 3Lu_{2z}\theta_{1y} - 3Lu_{2y}\theta_{1z} + 3Lu_{1z}\theta_{2y}$ $-3Lu_{2z}\theta_{2y} - 3Lu_{2y}\theta_{2z} + 3Lu_{1y}\theta_{1z} + 3Lu_{1y}\theta_{2z}$ $+L^2\theta_{1z}^2 - L^2\theta_{1y}\theta_{2y} - L^2\theta_{1y}^2 - L^2\theta_{2y}^2 + L^2\theta_{1z}\theta_{2z} + L^2\theta_{2z}^2$ Therefore, the optimal rotational angle e can be determined by the following procedure. First, if $I_y$ equals $I_z$ the cross section would be symmetrical with respect to two axes and no rotational angle can be determined. Thus, we assume the $I_y$ and $I_z$ are different.

If $C_2$ is equal to zero, $\cos(2\theta)$ will be equal to zero, and thus, $\theta$ is equal to either $-\pi/4$ or $\pi/4$.

If, on the other hand, $C_2$ is not equal to zero, a solution can be obtained from an equation, $\tan(2\theta) = -C_1/C_2$.

In either case, two or more solutions are determined. The sufficient condition for the solution is $$\frac{\partial^2 L}{\partial \theta^2} = \frac{\partial^2 l}{\partial \theta^2} = -\frac{8D}{L^3}(I_y - I_z)\{-C_1\sin 2\theta + C_2\cos 2\theta\} > 0.$$ (Eq 31)

By evaluating this equation, a solution can be determined.

In this manner, a rotational angle $\theta$ can be determined for an elliptical case. Thus, the main axis direction of the beam element can be determined and cross sectional design of the beam element can be performed in addition to the layout of the beam element in the optimization step.

Figure 5:
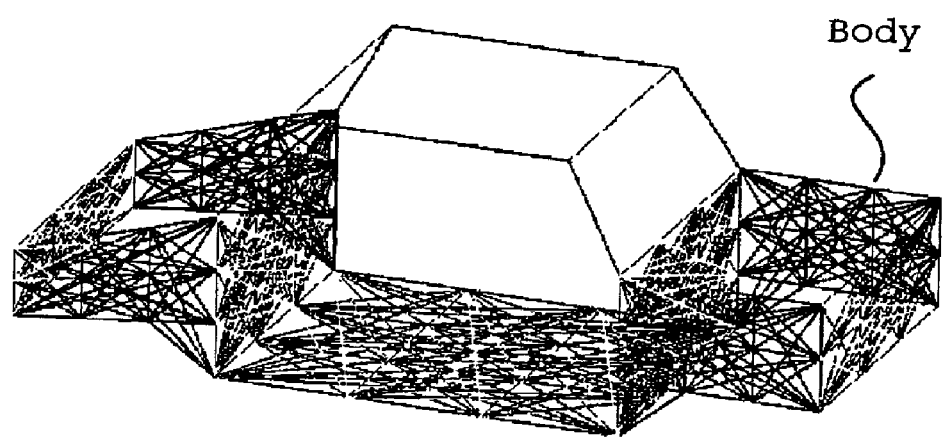
FIG. 5 is a diagram showing a design model for an automobile body.

FIG. 5 shows an example of applying the design method of the embodiment on an automobile body. FIG. 5 is a design model in which the design domain of an automobile body is constructed from a plurality of nodes 10 and beam elements 12.

Figure 6A:
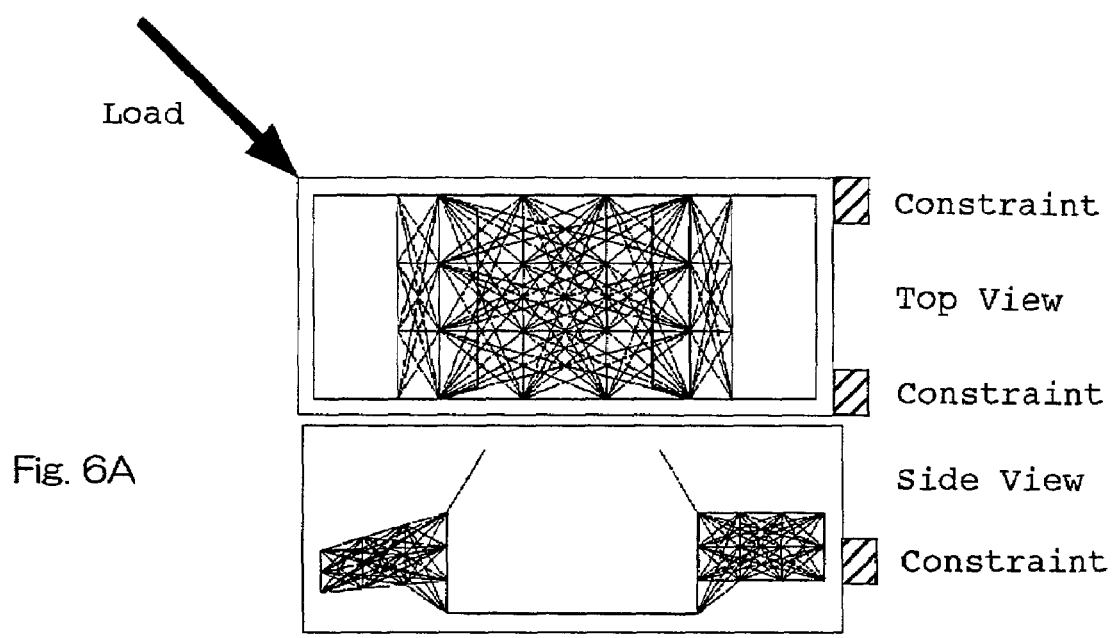
FIGS. 6A and 6B are diagrams explaining loads to be added to the automobile model depicted in FIG. 5.
Figure 6B:
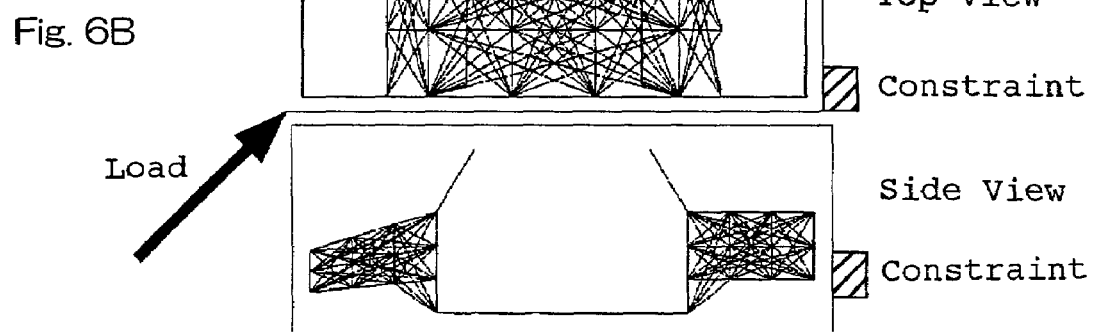

FIGS. 6A and 6B show an example where the design model depicted in FIG. 5 is given boundary conditions. A constraint in the right side is a fixing condition, and a load at the left side is an external force. FIG. 6A shows a case where a load is applied from top left of the top view. FIG. 6B shows a case where a load is applied from bottom left of the top view. An optimal stiffness is obtained in which the displacement is minimized when these loads are separately added (i.e. in so-called multi-loading).

Figure 7:
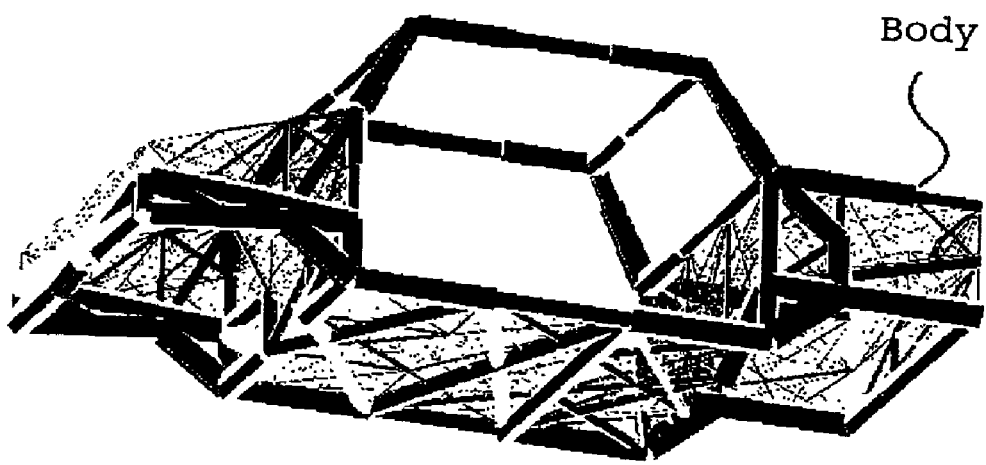
FIG. 7 is a diagram explaining a model for optimizing the automobile body depicted in FIG. 5.

FIG. 7 shows a result of the optimization on the design model depicted in FIG. 5 with a boundary condition depicted in FIGS. 6A and 6B, following the processing flowchart depicted in FIG. 2. Similar to FIG. 3, a reasonable initial shape is obtained with beam elements 12 having low sensitivity to the stiffness substantially removed and only the beam elements 12 having high sensitivity remaining.

The application of the design method according to the present invention is not limited to only an overall structure such as an automobile body or a skeleton structure of a building, and can also include a body skeleton.

Figure 8:
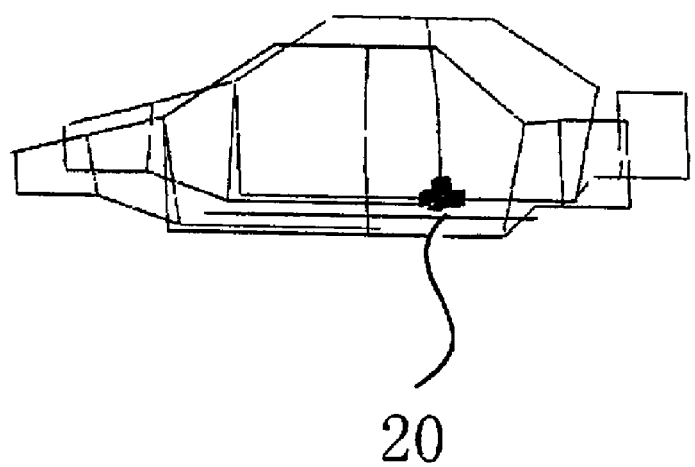
FIG. 8 is a descriptive diagram showing a connection section which is the object to be designed.

FIG. 8 shows an example partial structure to which the design method of the present invention can be applied. An initial shape for a connection section 20 in an automobile body can be generated.

Figure 9:
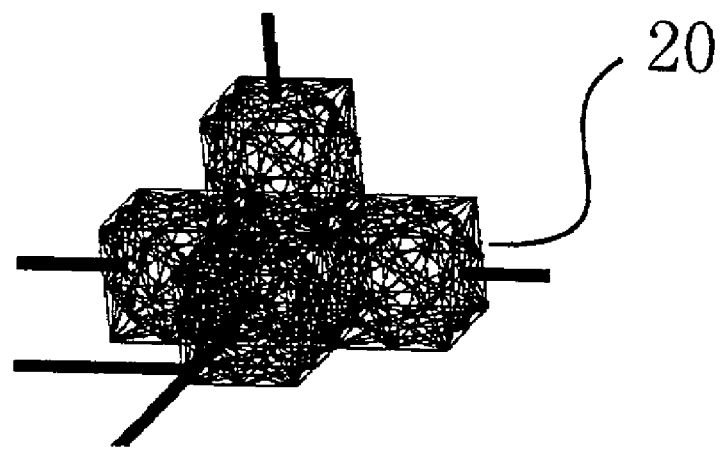
FIG. 9 is a diagram showing a design model of the connection section depicted in FIG. 8.

FIG. 9 shows a design model of a connection section 20. The design model is constructed from a plurality of nodes and beam elements connecting the nodes, similar to FIGS. 1 and 5.

Figure 10:
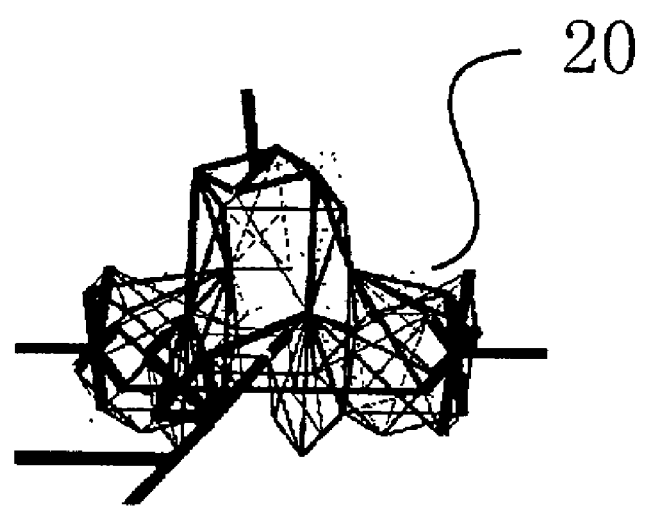
FIG. 10 is a diagram showing a model for optimizing the design model depicted in FIG. 9.

FIG. 10 shows a result of an optimization of the design model depicted in FIG. 9 following the processing flowchart depicted in FIG. 2 under a predetermined boundary conditions. Unnecessary beam elements having low sensitivity are substantially removed and a shape with the stiffness (that is, the cross-sectional area) of each beam element optimized is obtained. It is possible to further analyze in more detail by FEA using the shape depicted in FIG. 10 as an initial shape.

Because in an automobile body, for example, panels exist outside the design domain which add stiffness to the form within the design domain, it is preferable when designing an automobile body to optimize the form by considering the stiffness contribution by the panels. The stiffness contributions by of the panels can be added as a property of the nodes within the design domain. By performing the optimization using the nodes with the stiffness added to the beam elements, a form with optimized stiffness can be obtained, which takes the panels into consideration.

In the example used to illustrate the preferred embodiment, stiffness maximization was described as an example of optimization. However, the present invention can similarly be applied to optimization of eigenfrequency (a form with maximized eigenfrequency) or of flexibility. The optimization can be performed by determining the sensitivities of the beam elements with respect to the design variables and changing the design variables considering the sensitivities.

What is claimed is:

1. A computer-implemented method for designing a structure comprising the steps of:

discretizing the design domain of said structure by a plurality of nodes;

creating a design model by connecting adjacent nodes by beam elements and by connecting non-adjacent nodes by beam elements; and optimizing said design model, wherein a boundary condition is given to said design model, and said optimization is performed by correcting the stiffness of said beam elements.

2. A method according to claim 1, wherein, said boundary condition includes an external force applied to said structure, a fixed condition, and a volume constraint; and said optimization includes substantial removal of said beam elements.

3. A method according to claim 1, wherein, the cross section of said beam element has a shape which can be represented by two or more design variables.

4. A method according to claim 3, wherein, a dimension of said cross section and an angle of main axis of said cross section with respect to a coordinate system of said beam elements are determined at said optimization step.

5. A computer readable recording medium for recording a program for designing a model of a structure, characterized in that said program, when executed by a computer, causes said computer to, discretize the design domain of said structure by a plurality of nodes;

create a design model by connecting adjacent nodes by beam elements and by connecting non-adjacent nodes by beam elements; and optimize said design model, wherein said program, when executed by a computer, causes said computer to perform said optimization by correcting the stiffness of said beam elements based on an input boundary condition.

6. A recording medium according to claim 5, wherein, said boundary condition includes an external force applied to said structure, a fixed condition, and a volume constraint; and said optimization includes substantial removal of said beam elements.

7. A recording medium according to claim 5, wherein, the cross section of said beam element has a shape which can be represented by two or more design variables.

8. A recording medium according to claim 7, wherein a dimension of said cross section and angle of main axis of said cross section with respect to a coordinate system of said beam element is determined at said optimization step.

* * * * *